United States Patent [19]
Carter et al.

[11] Patent Number: 5,801,597
[45] Date of Patent: Sep. 1, 1998

[54] PRINTED-CIRCUIT BOARD-MOUNTABLE FERRITE EMI FILTER

[75] Inventors: Galen L. Carter, Longmont; David A. Norte; Woong K. Yoon, both of Westminster, all of Colo.

[73] Assignee: Lucent Technologies Inc., Murray Hill, N.J.

[21] Appl. No.: 795,431

[22] Filed: Feb. 5, 1997

[51] Int. Cl.⁶ .............................. H03H 7/09; H04B 3/28
[52] U.S. Cl. ................................... 333/12; 333/181
[58] Field of Search .......................... 333/12, 181, 185, 333/246; 336/65, 83, 175, 200, 226

[56] References Cited

U.S. PATENT DOCUMENTS

| | | | |
|---|---|---|---|
| 3,550,099 | 12/1970 | Stein | 336/65 |
| 4,636,752 | 1/1987 | Saito | 333/181 X |
| 4,751,479 | 6/1988 | Parr | 333/181 X |
| 4,908,586 | 3/1990 | Kling et al. | 333/182 |
| 5,025,211 | 6/1991 | Craft et al. | 333/12 X |
| 5,168,252 | 12/1992 | Naito | 333/181 X |
| 5,313,176 | 5/1994 | Upadhyay | 333/181 |
| 5,455,552 | 10/1995 | Metsler | 336/65 |
| 5,488,540 | 1/1996 | Hatta | 333/181 X |
| 5,497,129 | 3/1996 | Mantese et al. | 333/182 |
| 5,528,205 | 6/1996 | Wong | 333/177 |

FOREIGN PATENT DOCUMENTS

| | | | |
|---|---|---|---|
| 3-131112 | 6/1991 | Japan | 333/185 |

*Primary Examiner*—Seungsook Ham
*Attorney, Agent, or Firm*—David Volejnicek

[57] ABSTRACT

A printed circuit (PC) board-mountable ferrite electromagnetic interference (EMI) filter (702, 1003, 1003") for striplines (701, 1001, 1002) of a printed circuit (PC) board (700, 1000) that accommodates large numbers of striplines, and is cost-effective. One embodiment of the EMI filter is used with a PC board (700) that routes striplines (701) in a step-function (i.e., a "U"-shaped) pattern. The EMI filter comprises a ferrite body (702) that defines two parallel passageways (708, 709), i.e., has a figure-8 shape in cross section. The portion (710) of the PC board that defines the stripline portions extending in the one direction lies in one passageway, whereas the portion (711) of the PC board that defines the stripline portions extending in the other direction lies in the other passageway. A different embodiment of the EMI filter is used with a PC board (1000) that routes sets (1001, 1002) of striplines in a cross-hatch (i.e., a "#"-shaped) pattern, where the striplines end (are interrupted) before intersecting so that each stripline comprises two separate straight on-board parts. This EMI filter comprises a ferrite body (1003) that defines two orthogonal sets (1012, 1013) of off-board "U"-shaped conductors, one set for each orthogonal set of striplines with one conductor of a set for each stripline of a set. Each stripline's corresponding "U"-shaped conductor interconnects the two straight on-board parts of the stripline.

12 Claims, 10 Drawing Sheets

PRINTED-CIRCUIT BOARD-MOUNTABLE FERRITE EMI FILTER

TECHNICAL FIELD

This invention relates to filters for suppressing electromagnetic interference (EMI).

BACKGROUND OF THE INVENTION

Existing schemes for achieving EMI suppression are numerous. Nevertheless, the art has had little or no success in developing a cost-effective EMI filter that mounts directly onto a printed circuit (PC) board and that accommodates a large number of PC board-defined conductors (striplines).

Figure 1:
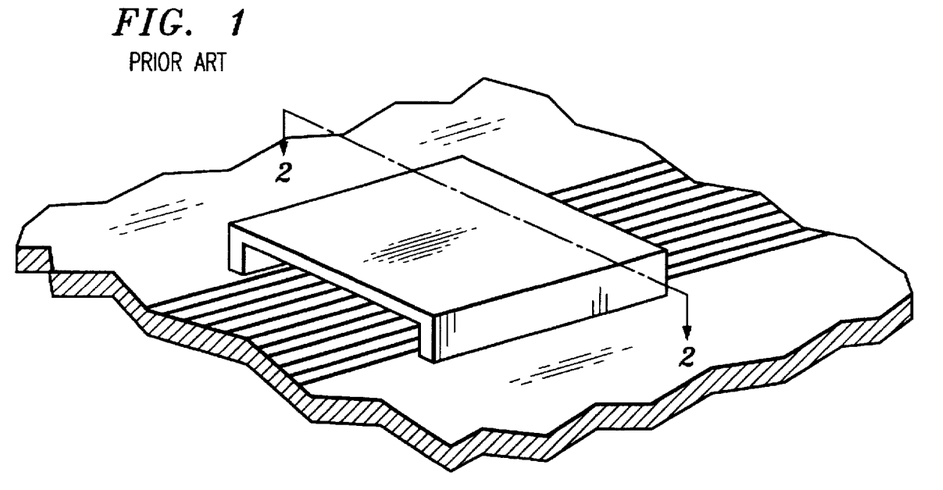
FIG. 1 is a perspective view of a first prior-art in-line ferrite EMI filter.
Figure 2:
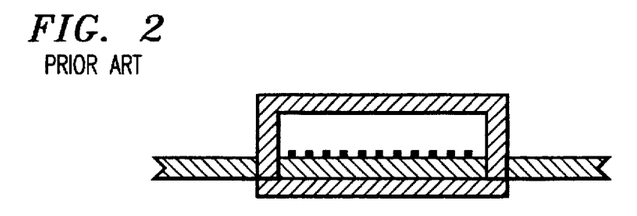
FIG. 2 is a cross-sectional view of the filter of FIG. 1.
Figure 3:
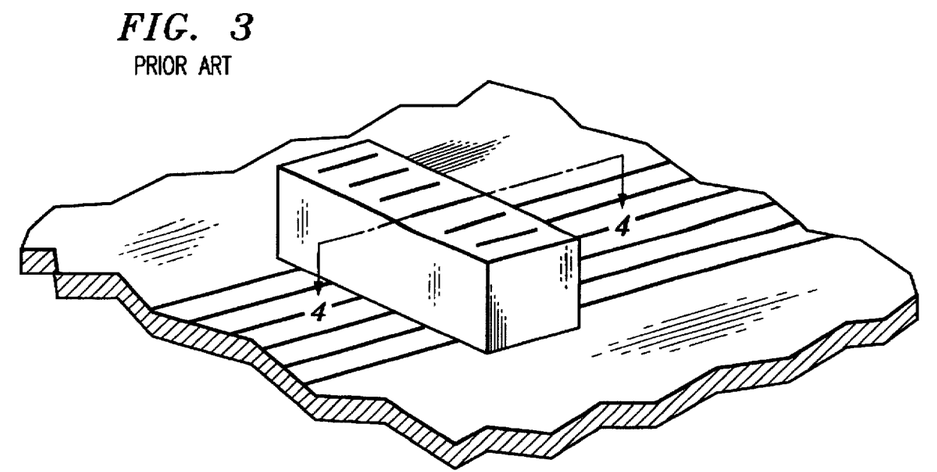
FIG. 3 is a perspective view of a second prior-art in-line ferrite EMI filter.
Figure 4:
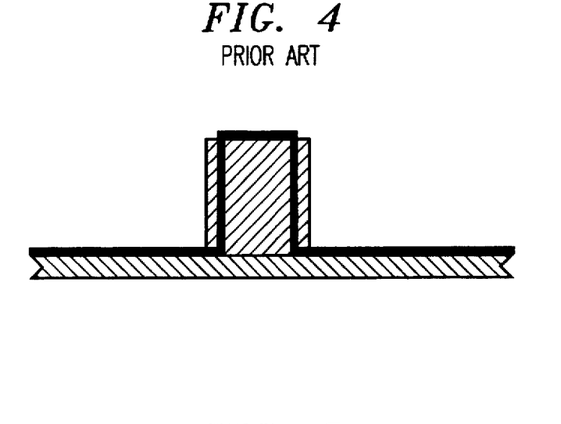
FIG. 4 is a cross-sectional view of the filter of FIG. 3.
Figure 5:
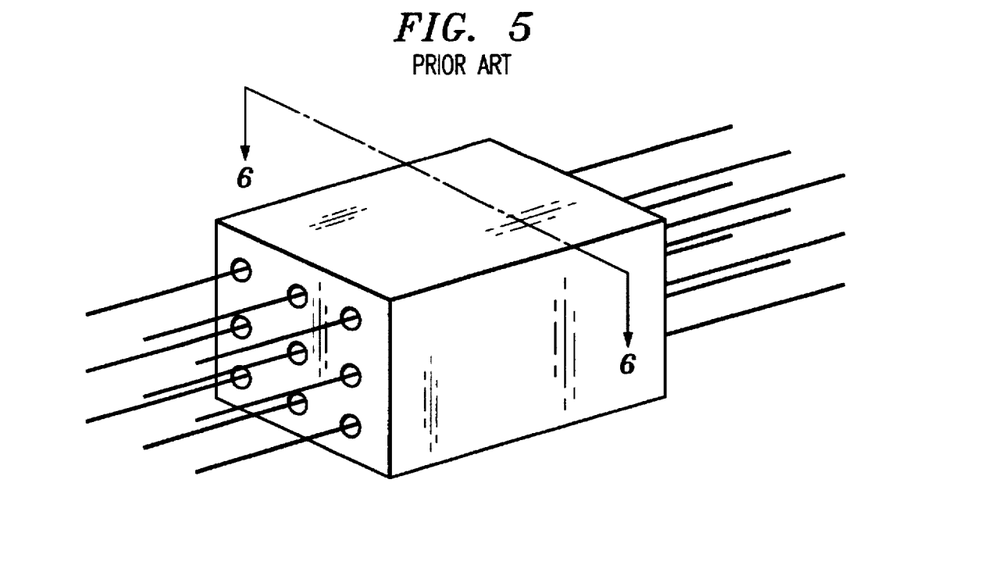
FIG. 5 is a perspective view of a third prior-art in-line ferrite EMI filter.
Figure 6:
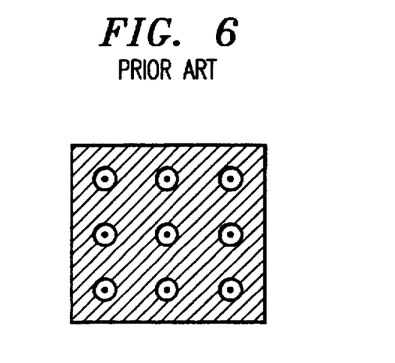
FIG. 6 is a cross-sectional view of the filter of FIG. 5.

An example of an existing EMI filter is a large ferrite core, which is a large (up to 5 cm or more in diameter) cylinder of ferrite material through which a bundle of signal-conducting wires is looped. Because of its size, the ferrite core is expensive and cannot be mounted directly onto PC boards. Moreover, because the conductors must be looped through the center of the core, the core cannot directly accommodate striplines, which are printed on the PC board. Since the large ferrite core is an off-board EMI suppression solution, its performance is not optimized because its physical distance from the source causing the EMI interference is not short. Another example of an existing EMI filter is a capacitive connector, which is a connector that has each pin or socket connected to ground by a shunting capacitor. Due to the large number of components involved, a capacitive connector is not cost-effective. Moreover, the capacitors cause significant attenuation not only of the interfering signals, but of the desired signals as well, and they are effective only at high frequencies (greater than about 200 MHz). Another drawback is that capacitive connectors are not transparent to differential (bidirectional) mode signals, such as tip and ring phone signals. Although capacitive connectors are PC board-mountable, they are limited in the number of striplines that they can accommodate—typically fewer than 50. Yet other examples of existing PC board-mountable EMI filters are in-line ferrite devices such as those shown in FIGS. 1–6. Due to its geometrical structure, the filter of FIGS. 1–2 provides low, and therefore often inadequate, EMI suppression. The filter of FIGS. 3–4 also provides low suppression, plus it has a low capacity in the number of signal lines that it can reasonably accommodate. Also, this device is not transparent to differential (bidirectional) signals. Finally, the filter of FIGS. 5–6 also has a low capacity in the number of signal lines that it can accommodate, because its performance degrades rapidly with increases in its size (its circumference). This device is also not transparent to differential signals. Furthermore, just like the ferrite core, it cannot directly accommodate striplines.

SUMMARY OF THE INVENTION

This invention is directed towards solving these and other problems and disadvantages of the prior art. Generally, according to the invention, a ferrite (preferably a planar magnetic ferrite) EMI filter is provided for striplines of a PC board that defines at least one set of striplines each comprising at least one stripline. The EMI filter comprises a ferrite body that is adapted for mounting onto the PC board and that defines either passageways for the striplines of the at least one set or conductive extensions of the striplines of the at least one set, which passageways or conductive extensions extend through the body in both a first direction and in a second direction opposite to the first direction. A circuit pack comprising the PC board and the EMI filter is also provided. Illustratively, the purpose of the circuit pack is to allow the planar magnetic EMI device to be packaged as a module for plug-in or peripheral applications. Otherwise, the planar magnetic EMI device is mounted directly onto the host PC board or backplane.

According to one aspect of the invention, an EMI filter, for striplines of a PC board that has a first portion defining at least one stripline extending in a first direction and a second portion defining said at least one stripline extending in a second direction substantially opposite to the first direction, comprises a ferrite body adapted for mounting on the PC board and defining at least a pair of substantially parallel tunnels. The first portion of the PC board and the striplines defined thereby extend through one of the tunnels, and the second portion of the PC board and the striplines defined thereby extend through the other tunnel. This geometry can be extended to include N tunnels, in which N>2, illustratively by adding additional ferrite "legs" to the structure.

Advantageously, the EMI filter uses a planar magnetic structure and a simple stripline routing pattern, which makes the filter inexpensive to manufacture and to use. The EMI filter can also accommodate a large number (for example, 50 or more) striplines, yet mounts directly onto the PC board, which also makes use of the filter cost-effective. Furthermore, the filter effectively accommodates both single-layer and multi-layer PC boards. Due to its unique geometry, this planar magnetic device provides significant EMI suppression for all striplines routed through the device.

According to another aspect of the invention, an alternative EMI filter, for striplines of a PC board that defines a first set of striplines comprising at least one stripline and a second set of striplines comprising at least one stripline, comprises a ferrite body adapted for surface-mounting onto the PC board and defining a first set and a second set of substantially "U"-shaped conductors. Each "U"-shaped conductor of the first set of conductors is conductively connected in series with a different one of the striplines of the first set of striplines and extends substantially in parallel with the other "U"-shaped conductors of the first set of conductors through the ferrite body. Each "U"-shaped conductor of the second set of conductors is conductively connected in series with a different one of the striplines of the second set of striplines and extends substantially in parallel with the other "U"-shaped conductors of the second set of conductors through the ferrite body. The "U"-shaped conductors of the second set of conductors are oriented with respect to the "U"-shaped conductors of the first set of conductors such that planes in which lie the "U"-shaped conductors of the first set of conductors are substantially orthogonal to planes in which lie the "U"-shaped conductors of the second set of conductors.

Advantageously, the EMI filter uses multi-layer magnetic structures which make it simple and inexpensive to manufacture. The EMI filter is compact, can accommodate a large number of striplines, and is suitable for either surface mounting or through-hole mounting to the PC board, which makes use of the filter efficient and cost-effective, as well as compatible with common circuit-pack manufacturing technology. Furthermore, the filter effectively accommodates both single-layer and multi-layer PC boards. The capacity (number of PC board striplines) that this device can accommodate increases as the number of device layers are increased in the dimension orthogonal to the layers.

These and other advantages and features of the present invention will become more apparent from a description of an illustrative implementation of the invention taken together with the drawing.

DETAILED DESCRIPTION

Figure 7:
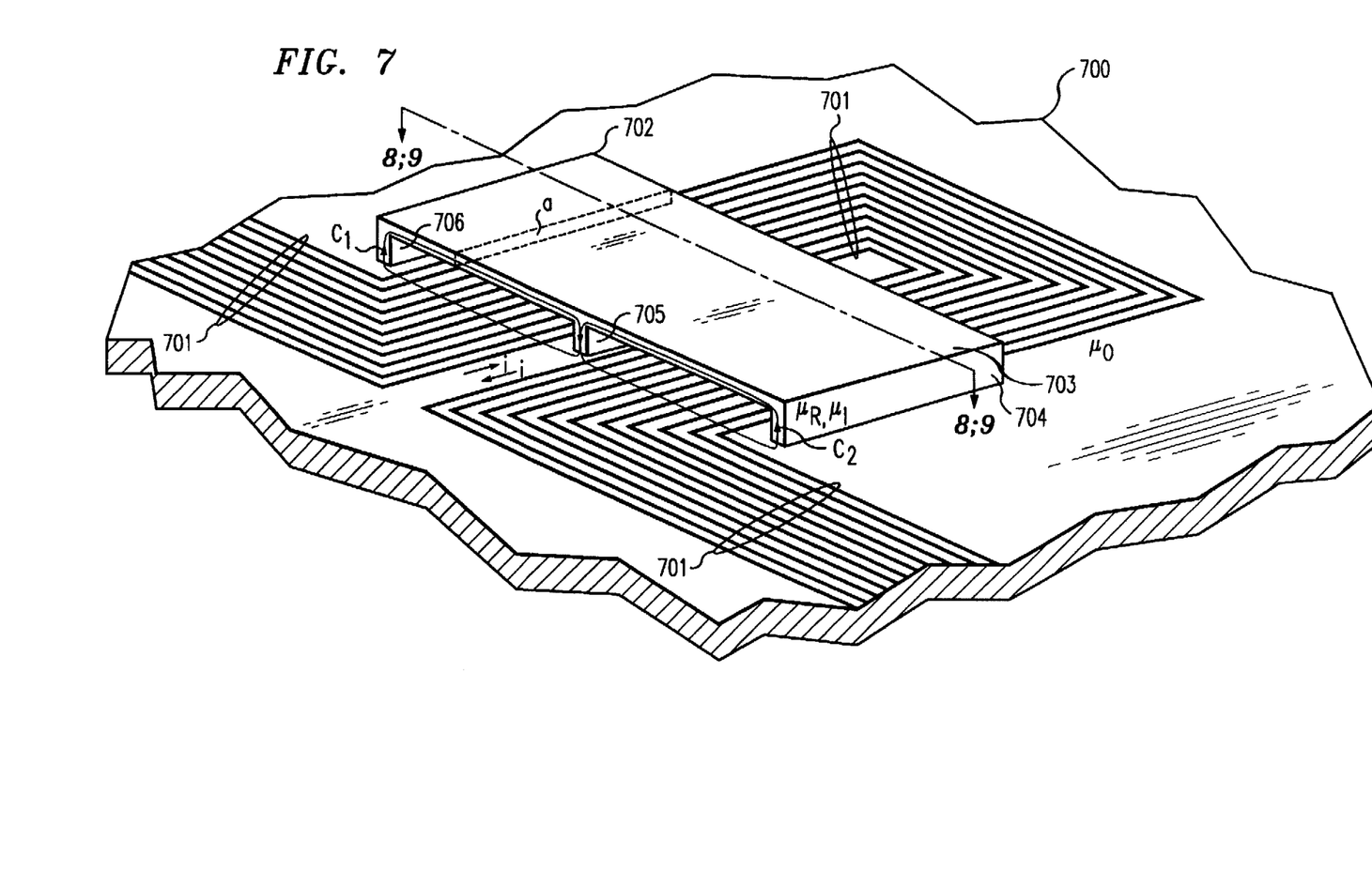
FIG. 7 is a perspective view of a first illustrative embodiment of a ferrite EMI filter configured according to the invention.
Figure 8:
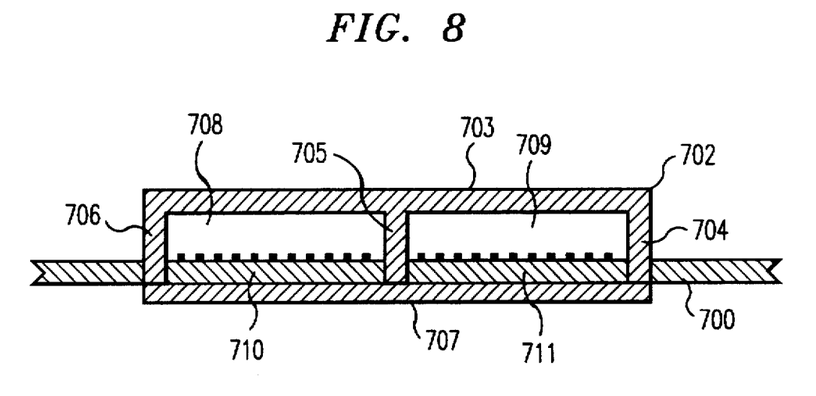
FIG. 8 is a cross-sectional view of the filter of FIG. 7.

FIGS. 7–8 show a PC board-mounted EMI filter 702 characterized by "E-I"-shaped planar magnetic structures and a simple stripline routing pattern. EMI filter 702 is made of any desired ferrite ceramic material, such as nickel-zinc (NiZn) or manganese-zinc (MnZn)-based materials. Suitable materials illustratively include the nickel-zinc materials 25, 27, 28, 29 and 31 of Steward, Inc. of Chattanooga, Tenn. and the manganese-zinc materials 3S1, 3S3 and 3S4 of Philips Components of The Netherlands. Other lossy ferrites, both conductive and non-conductive, may be used as well. EMI filter 702 comprises a portion 703 having an "E" shape (a trident shape) in cross-section and a portion 707 having an "I" shape (flat) in cross-section. EMI filter 702 can alternatively comprise two "E"-shaped portions. Portion 703 is mounted to one side of PC board 700 over striplines 701, and portion 707 is mounted to the other side of PC board 700 underneath portion 703. The outer legs 704 and 706 and the inner leg 705 of portion 703 extend through rectangular holes in PC board 700 to make contact with portion 707. The assembled EMI filter 702 thus has a figure-8 shape that defines two passageways, or tunnels 708 and 709, that encircle striplines 701. Each stripline 701 is routed by PC board 700 in a step-function (a "U"-shaped) pattern and winds through both tunnels 708 and 709 in opposite directions. Both the striplines 701 and the portions 710 and 711 of PC board 700 which route striplines 701 in opposite directions extend through tunnels 708 and 709 and are surrounded by EMI filter 702. The current (i) flowing through each stripline 701 induces a magnetic flux that is captured by filter 702. The aggregate flux, denoted by contours $C_1$ and $C_2$ within filter 702, induces an impedance (Z) across each stripline that presents a barrier to common-mode electromagnetic interference and thus constitutes an EMI choke. The impedance (Z) produced across each stripline 701 by filter 702 is defined by the following equation:

$$Z = j2\pi f \left[ \frac{2Na}{L} \right] \mu_r \mu_o + 2\pi f \left[ \frac{2Na}{L} \right] \mu_i \mu_o$$

where $j=\sqrt{-1}$ f=EMI signal frequency

N=number of striplines 701 a=cross-sectional area, perpendicular to the magnetic contours (C), of a wall of filter 702

L=the mean (average) path-length of magnetic contours (C), where $L=LC_1=$length of contour $C_1=LC_2=$length of contour $C_2$ $\mu_o=$free-space permeability ($4\pi \times 10^{-7}$H/m) $\mu_r=$real component of permeability of the material of filter 702

$\mu_i=$imaginary component of permeability of the material of filter 702.

The first half of the equation defines the reactive component of the impedance (Z), and the second half of the equation defines the resistive component of the impedance.

Figure 9:
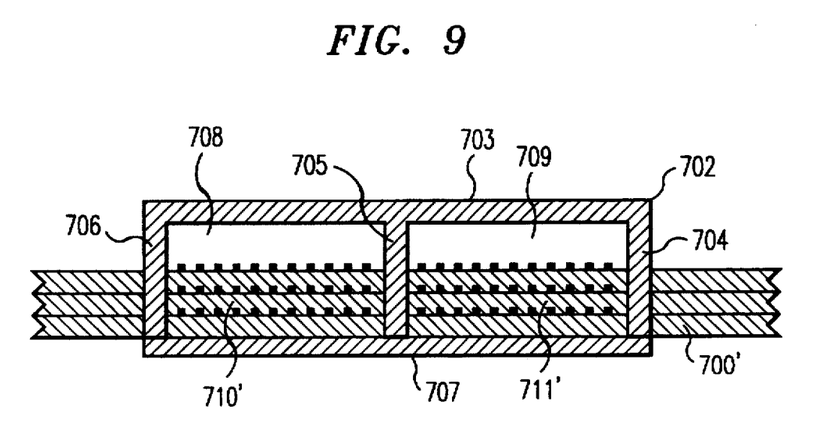
FIG. 9 is an alternative cross-sectional view of the filter of FIG. 7 for multi-layer PC boards.

FIG. 9 shows how the stripline capacity of filter 702 may be substantially increased without substantially increasing the mean path-length (L) of magnetic contours (C). In this configuration, filter 702 is used with a multi-layer PC board 700' instead of the single-layer PC board 700 of FIG. 8. Each layer of PC board 700' defines a set of striplines 701', and the sets are stacked one on top of the other. Filter 702 encircles striplines 701' defined by PC board portions 710' and 711' of all layers of PC board 700'.

An experimental demonstration was conducted to determine the radiated emissions spectra of the filter 702 of FIG. 7 vis-a-vis those of a ferrite core and a capacitive connector. Eighteen striplines were passed through the two tunnels of filter 702; eighteen 24-ga wires were looped through a NiZn ferrite core; and eighteen striplines were connected to the capacitors of a capacitive connector. Their respective average margins were then determined; by definition, the average margin is the average of the radiated emissions spectrum for the ten frequencies that have the least EMI suppression. The respective average margins were found to be 6.6 dB, 5.8 dB, and 6.3 dB, showing that filter 702 performs better than both the ferrite core and the capacitive connector. Yet because of its shape and configuration, filter 702 is to produce and to mount on PC boards, and hence is relatively inexpensive.

Figure 10:
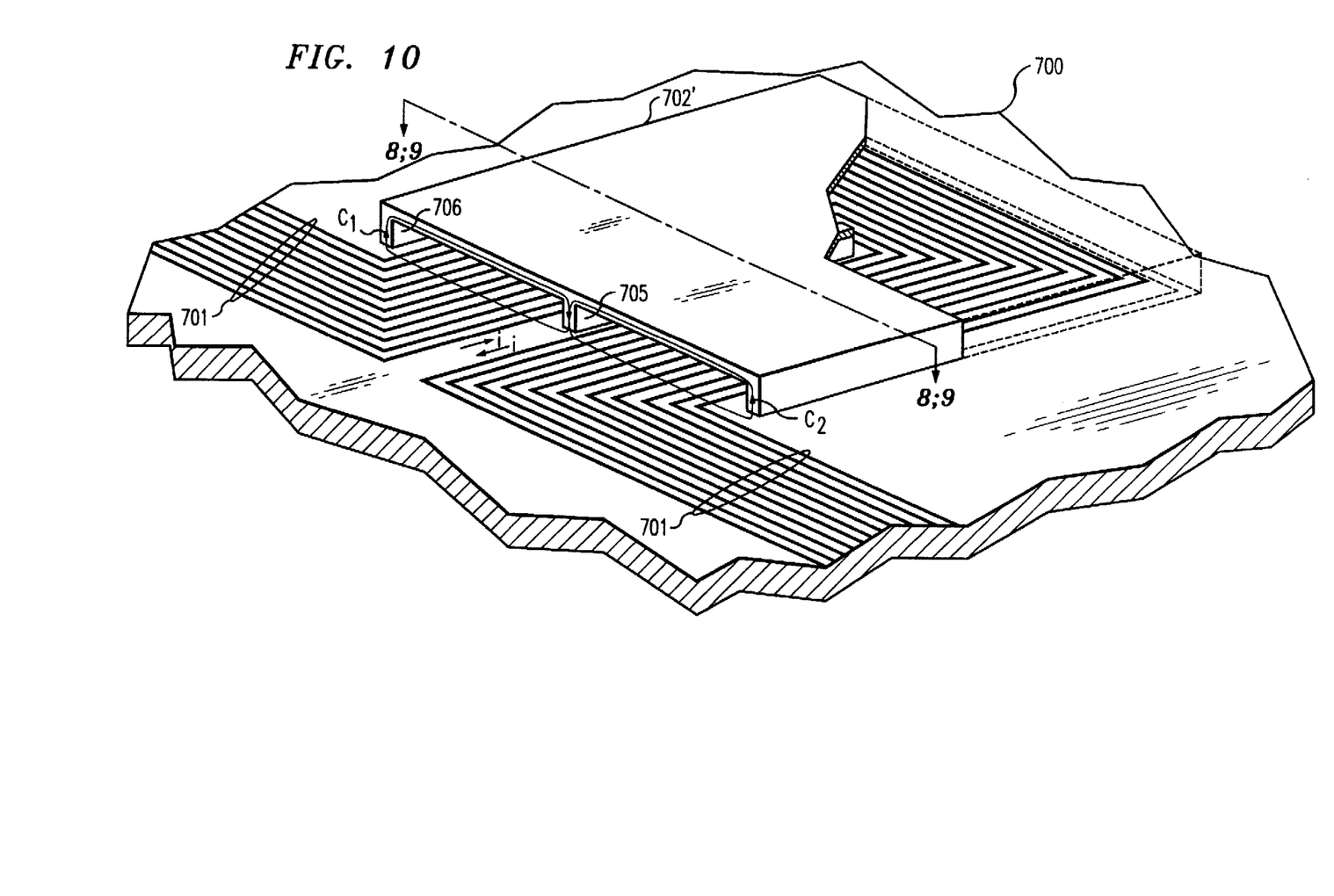
FIG. 10 is a partial cut-away view of an alternative embodiment of the filter of FIG. 7.

FIG. 10 shows an alternative embodiment of the filter of FIG. 7, designated by the numeral 702'. This embodiment encloses not only the legs of the "U"-shaped portions of striplines 701, but the entire "U"-shaped portions of striplines 701, thereby increasing the amount of EMI attenuation provided by the filter.

Figure 11:
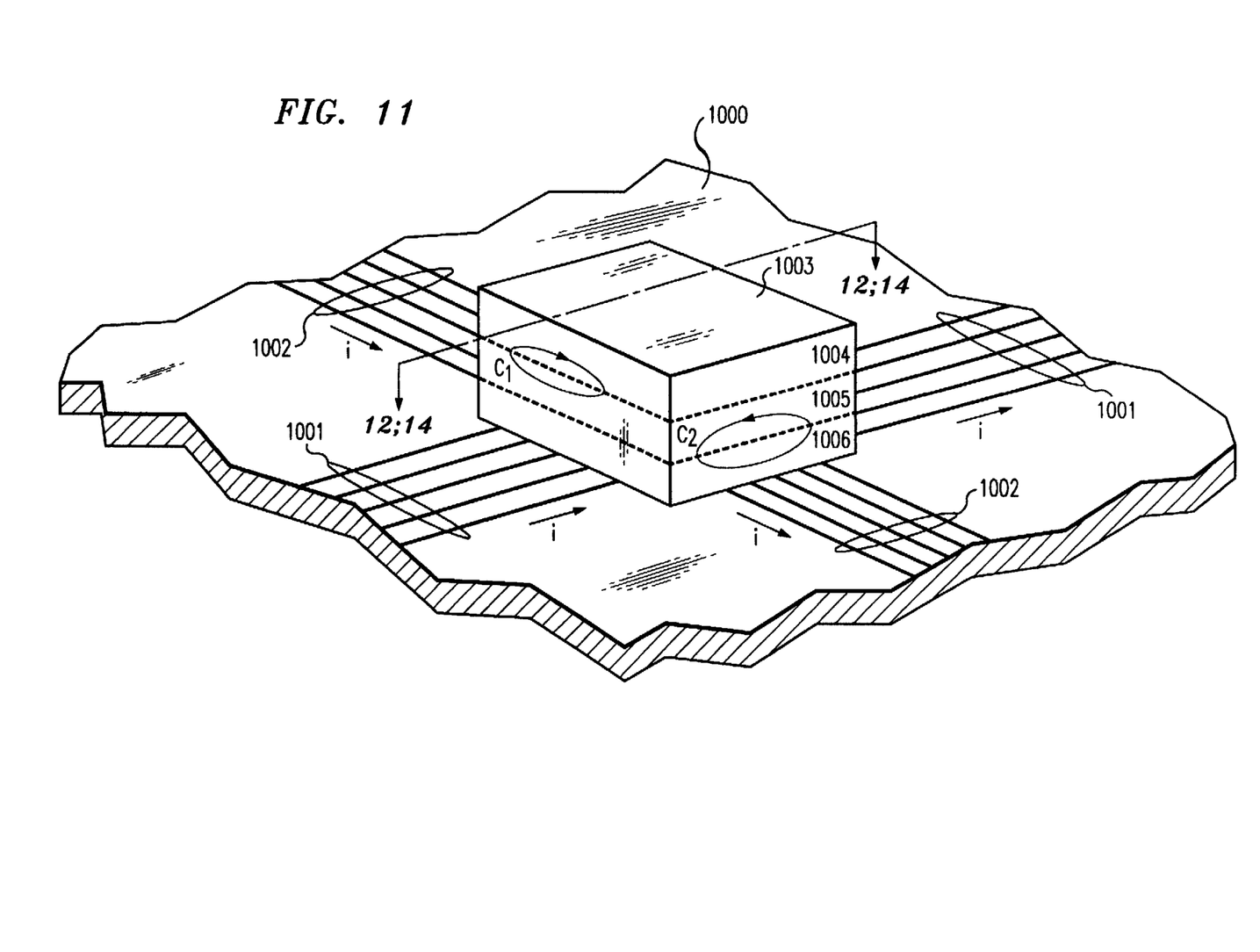
FIG. 11 is a perspective view of a second illustrative embodiment of a ferrite EMI filter configured according to the invention.
Figure 12:
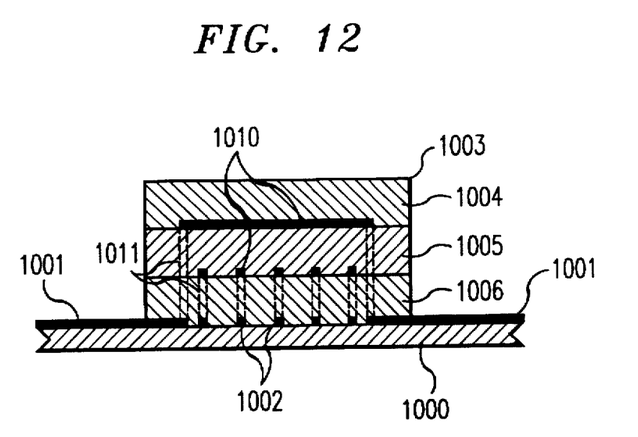
FIG. 12 is a cross-sectional view of the filter of FIG. 11.
Figure 13:
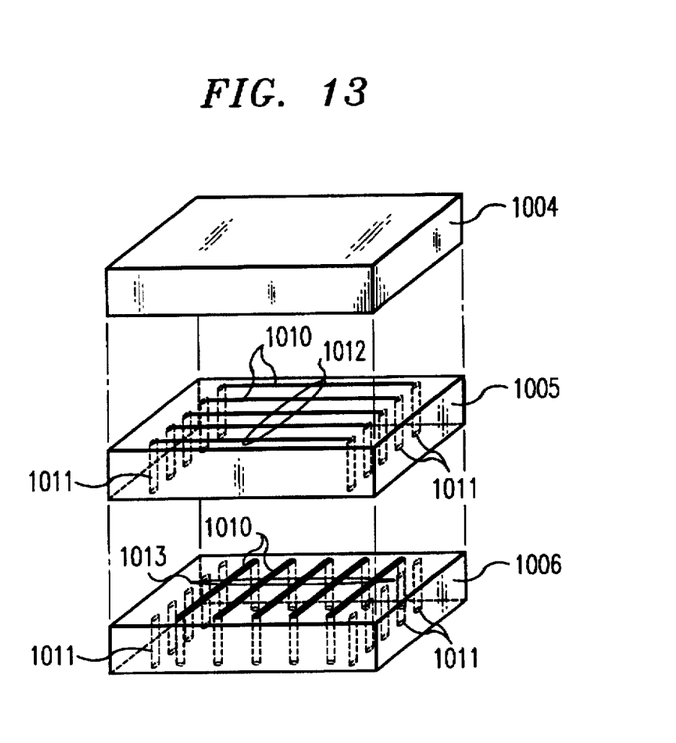
FIG. 13 is an exploded view of the filter of FIG. 11.

Alternatively, FIGS. 11–13 show a PC-board-mounted EMI filter 1003 characterized by a multi-layer magnetic structure, by large stripline capacity, and by its suitability for surface-mounting or through-hole mounting via conventional PC surface-mount techniques. Like EMI filter 702 of FIGS. 7–9, EMI filter 1003 is made of ferrite material. Filter 1003 is mounted to the surface of a PC board 1000 that has a plurality of striplines 1001–1002. The striplines form two sets 1001 and 1002 of striplines, each comprising approximately one-half of the total number of striplines, and each set enters and exits filter 1003 orthogonally to the other set, thereby forming a cross-hatch (a "#"-shaped) routing pattern. Each stripline of both sets is interrupted before it crosses the striplines of the orthogonal set. Thus, each stripline comprises two separate parts. The two parts of each stripline are interconnected by "U"-shaped conductors defined by filter 1003. Filter 1003 defines two sets 1012 and 1013 of "U"-shaped conductors, one set for each set 1001 and 1002 of striplines. The conductors of the two sets 1012 and 1013 are orthogonal to each other.

The "U"-shaped conductors are formed by filter 1003 as follows. Filter 1003 comprises a plurality of planar magnetic layers 1004–1006 that abut each other in series. In the manufacturing of filter 1003, layers 1004–1006 are stacked together via conventional multi-layer magnetic technologies. Layers 1004–1006 stack portions of the conductors of sets 1012 and 1013 vertically one above the other and orthogonally to each other within filter 1003. Lowest layer 1006 defines vertical conductive (metallized) vias 1011 therethrough for both sets 1012 and 1013 of conductors, two vias per stripline, and defines on its upper surface conductive links 1010, one for each pair of vias 1011 of one set 1002 of striplines. Alternatively, links 1010 could be defined by the lower surface of middle layer 1005. Middle layer 1005 defines vertical conductive vias 1011 therethrough for the other set 1012 of conductors, two vias per stripline, and defines on its upper surface conductive links 1010, one for each pair of vias 1011 of the set 1001 of striplines. Alternatively, links 1010 could be defined by the lower surface of upper layer 1004. Vias 1011 defined by middle layer 1005 are connected to striplines of the set 1001 by vias 1011 defined by lowest layer 1006. Hence, each "U"-shaped conductor is formed by a connecting link 1010 and a pair of conductive vias 1011 in each filter-body layer. If filter 1003 is made of non-conductive material like nickel-zinc ferrite, conductive vias 1011 and links 1010 may be deposited directly on the material. But if filter 103 is made of conductive material like manganese-zinc ferrite, the conductors of vias 1011 and links 1010 must be insulated from the material.

Links 1010 defined by lowest layer 1006 and links 1010 defined by middle layer 1005 are orthogonal to each other. The orthogonal orientation of the two sets of links 1010 allows the EMI suppression of each set 1001 and 1002 of striplines to be accomplished independently of each other. If the two sets of links 1010 were parallel to each other, the contour of their aggregate flux would surround both sets of links 1010. But with the orthogonal orientation of the two sets of links 1010, the dot product of their (orthogonal) magnetic fields is zero, and each set of links 1010 has its own aggregate flux contour ($C_1$, $C_2$) that surrounds only the corresponding one set of links. The orthogonal orientation also impedes any potential signal crosstalk between the sets of links 1010. In the shown embodiment, upper layer 1004 of filter 1003 defines neither vias 1011 nor links 1010, and merely serves as a loop-closing path for magnetic flux ($C_1$) induced by current in links 1010 that are defined by layer 1005.

Not only is filter 1003 easier to mount on a PC board than filter 702 of FIGS. 7–9, it also shortens the mean path-length (L) of magnetic contours (C) approximately by half compared to filter 702. Hence, filter 1003 can accommodate twice as many striplines as filter 702 for the same amount of EMI suppression.

Figure 14:
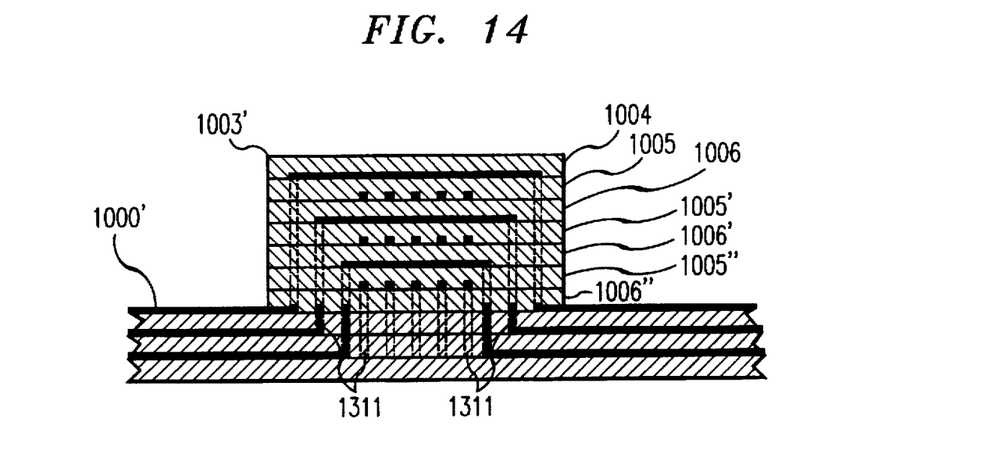
FIG. 14 is an alternative cross-sectional view of the filter of FIG. 11 for multi-layer PC boards.

Like filter 702, filter 1003 may be used in conjunction with a multi-layer PC board to substantially increase its stripline capacity without substantially increasing the mean path-length (L) of magnetic contours (C). This is shown in FIG. 14, wherein filter 1003' is surface-mounted onto a multi-layer PC board 1000'. The striplines defined by layers that lie below the top layer of PC board 1000' connect to filter 1003' by means vertical conductive (metallized) vias 1311 through the PC-board layers that lie above them. Illustratively, filter 1003' has a pair of planar magnetic layers 1005–1006, 1005'–1006', and 1005"–1006" for each layer of PC board 1000'. Each planar magnetic layer's links 1010 are orthogonal to links 1010 of each adjacent planar magnetic layer, thereby retaining the independence of EMI suppression effected by each planar magnetic layer.

Figure 15:
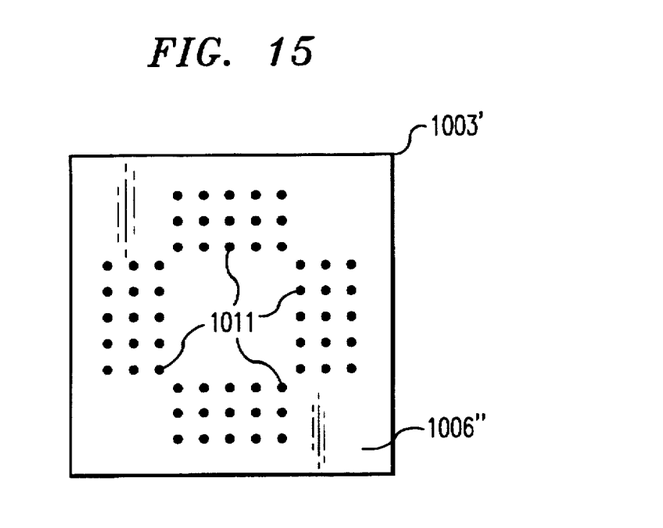
FIG. 15 is a bottom view of the filter of FIG. 14.

To maintain a desirable separation between vias 1011 defined by the layers of filter 1003', yet at the same time keeping the outside dimensions of filter 1003' to a minimum, filter 1003' defines each set of vias 1011 that correspond to one set 1001 of striplines of each PC board layer in parallel, rather than in series, with the sets of vias 1011 that correspond to the one set 1001 of striplines of the other PC-board layers, and likewise defines each set of vias 1011 that correspond to the other set 1002 of striplines of each PC board layer in parallel with the sets of vias 1011 that correspond to the other set 1002 of striplines of the other PC-board layers. This is shown in FIG. 15.

Figure 16:
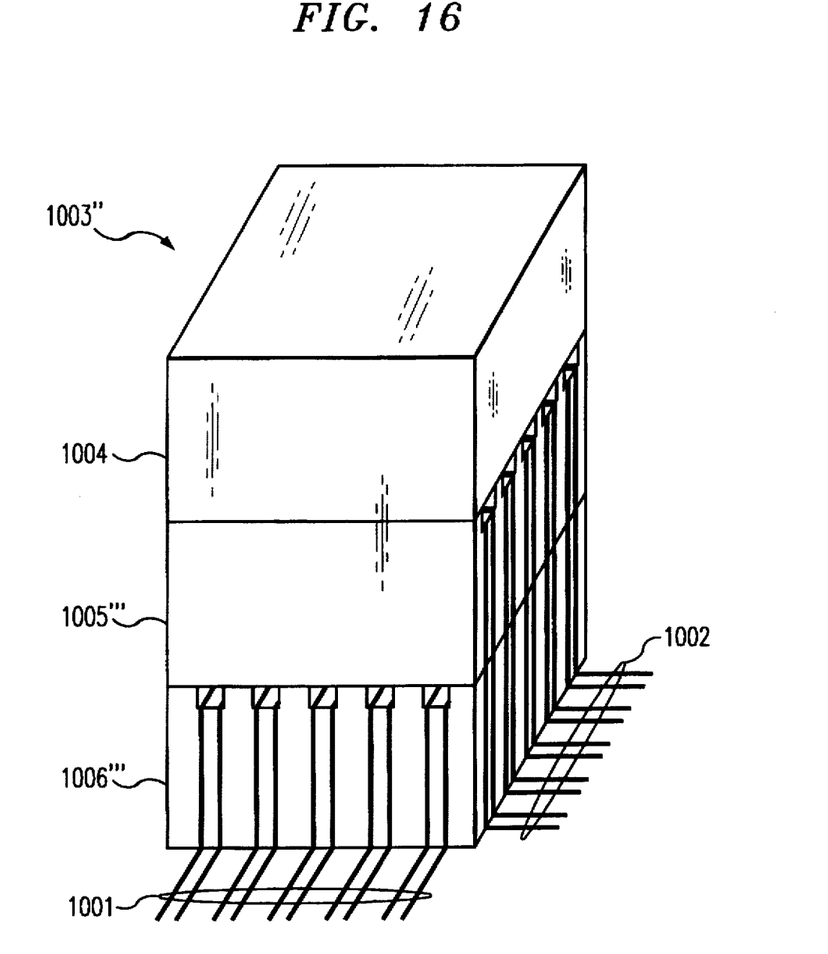
FIG. 16 is a perspective view of a third illustrative embodiment of a ferrite EMI filter configured according to the invention.
Figure 17:
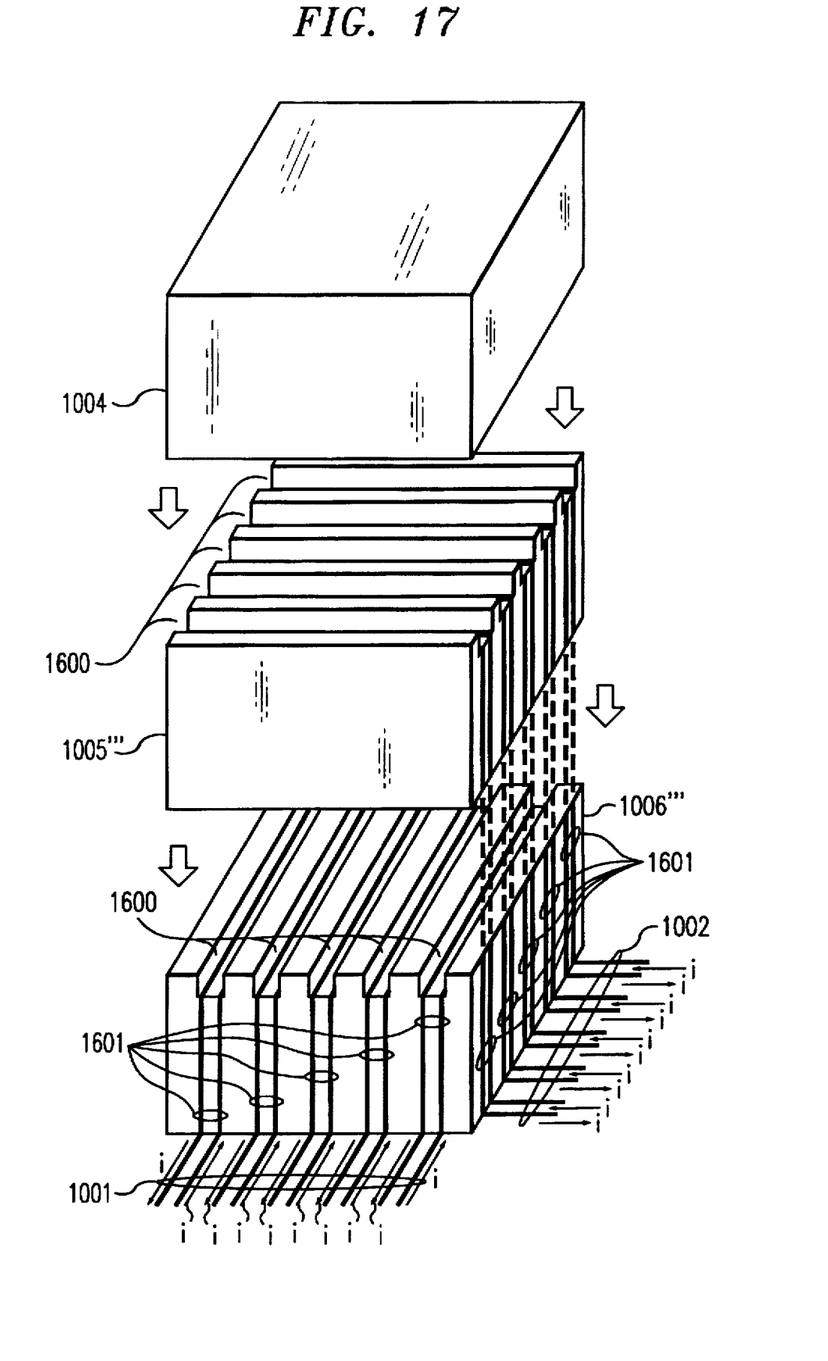
FIG. 17 is an exploded view of the filter of FIG. 16.

The EMI filters shown in FIGS. 11–15 are not transparent to differential mode signals. But a simple modification to these devices results in a differential-mode-transparent EMI filter 1003" shown in FIGS. 16–17. This modification entails etching "wells" 1600 within the ferrite layers 1005" and 1006" for every pair 1601 of bidirectional striplines 1001 or 1002. For example, each pair 1601 of striplines comprises a tip (T) line and a ring (R) line of a telephony link. To avoid having to form the metallized vias 1011 of filter 1003 of FIGS. 11–15 in pairs having very close proximity to each other, filter 1003" avoids the use of vias 1011 and instead has striplines 1001 and 1002 deposited on the surfaces thereof, as shown in FIGS. 16–17. Alternatively, metallized partial vias can be used that are only partially embedded within the ferrite body. The metallized vias should be partially exposed to the surrounding air medium so as not to trap the flux lines in the ferrite body. Each well 1600 enables the common-mode magnetic flux produced by a given pair 1601 of bidirectional striplines 1001 or 1002 to induce an impedance that acts as a barrier to the EMI interference. On the other hand, for bidirectional communication via a pair of striplines 1001 or 1002 inside a given "well" 1600, the differential magnetic flux produced by the pair 1601 of striplines will cancel each other and will not attenuate the desired bidirectional signals.

Of course, various changes and modifications to the illustrative embodiments described above will be apparent to those skilled in the art. For example, the filters may be constructed from hybrid materials, such as a combination of NiZn and MnZn, whereby tuning of the impedance of the filters is facilitated. Also, the winding of the striplines through the filter structure may be shaped differently, as long as it retains a substantially "U"-shape (e.g., step-function shape, omega shape, back-to-back "U"-shape, multiple-loop shape, etc.). Such changes and modifications can be made without departing from the spirit and the scope of the invention and without diminishing its attendant advantages. It is therefore intended that such changes and modifications be covered by the following claims.

The invention claimed is:

1. A circuit pack comprising:
   a PC board having a first portion defining along a surface of the first portion at least one planar conductor extending in a first direction and having a second portion defining along a surface of the second portion said at least one conductor extending in a second direction substantially opposite to said first direction, and a ferrite EMI filter having a ferrite body mounted on the PC board and defining a pair of passageways substantially parallel to each other and to the surfaces of the first and the second portion, the first portion of the PC board and the at least one planar conductor defined thereby extending through one of the passageways and the second portion of the PC board and the at least one planar conductor defined thereby extending through another of the passageways.

2. The circuit pack of claim 1 wherein:

the filter ferrite body has a substantially figure-8 shape in cross section perpendicular to the at least one planar conductor.

3. The circuit pack of claim 1 wherein:

the filter ferrite body comprises a first ferrite body portion having a substantially "E" shape defining three legs in cross section perpendicular to the at least one planar conductor, and a planar second body portion, wherein the legs of the first body portion extended through openings defined by the PC board from one side of the PC board to another side of the PC board such that the at least one planar conductor extends between the legs and the second body portion connects the legs together on the other side of the PC board to form the passageways with the first body portion.

4. The circuit pack of claim 1 wherein:

the ferrite body comprises at least one of (a) a nickel-zinc material and (b) manganese-zinc material.

5. The circuit pack of claim 1 wherein:

the PC board is a multi-layer board and the first and the second portions of the PC board each define at least one planar conductor on each one of a plurality of the layers.

6. The circuit pack of claim 1 wherein:

each said at least one planar conductor has a substantially "U"-shaped portion, and said pair of passageway are joined to form a substantially "U"-shaped passageway that envelopes the "U"-shaped portions of said at least one planar conductor.

7. An EMI filter for conductors of a PC board having a first portion defining along a surface of the first portion at least one planar conductor extending in a first direction and having a second portion defining along a surface of the second portion said at least one planar conductor extending in a second direction substantially opposite to said first direction, the EMI filter comprising:

a ferrite body for mounting on the PC board and defining a pair of passageways substantially parallel to each other and to the surfaces of the first and the second portion, the first portion of the PC board and the at least one planar conductor defined thereby extending through one of the passageways and the second portion of the PC board and the at least one planar conductor defined thereby extending through another of the passageways.

8. The EMI filter of claim 7 wherein:

the filter ferrite body has a substantially figure-8 shape in cross-section perpendicular to the at least one planar conductor.

9. The EMI filter of claim 7 wherein:

the filter ferrite body comprises a first ferrite body portion having a substantially "E" shape defining three legs in cross section perpendicular to the at least one planar conductor and a planar second body portion, wherein the legs of the first body portion extend through openings defined by the PC board from one side of the PC board to another side of the PC board such that the at least one planar conductor extends between the legs, and the second body portion connects the legs together on the other side of the PC board to form the passageways with the first body portion.

10. The EMI filter of claim 7 wherein:

the ferrite body comprises at least one of (a) a nickel-zinc material and (b) a manganese-zinc material.

11. The EMI filter of claim 7 wherein the PC board is a multi-layer PC board, and the first and the second portions of the PC board each define at least one planar conductor on each one of a plurality of the layers.

12. The EMI filter of claim 7 for a PC board wherein each said at least one planar conductor has a substantially "U"-shaped portion, wherein:

said pair of passageways are joined to form a substantially "U"-shaped passageway that envelopes the "U"-shaped portions of said at least one planar conductor.

* * * * *